United States Patent
Deimel et al.

(10) Patent No.: US 8,353,721 B2
(45) Date of Patent: Jan. 15, 2013

(54) CABLE CONNECTION DEVICE, LINE FEEDTHROUGH PROVIDED THEREWITH, AND USE THEREOF

(75) Inventors: Peter Deimel, Langenpreising (DE); Nicholas E. Brownjohn, Buxtehude (DE)

(73) Assignee: Airbus Operations GmbH, Hamburg (DE)

( * ) Notice: Subject to any disclaimer, the term of this patent is extended or adjusted under 35 U.S.C. 154(b) by 0 days.

(21) Appl. No.: 13/194,646

(22) Filed: Jul. 29, 2011

(65) Prior Publication Data
US 2012/0015555 A1   Jan. 19, 2012

Related U.S. Application Data

(63) Continuation of application No. PCT/EP2010/051684, filed on Feb. 11, 2010.

(30) Foreign Application Priority Data

Feb. 12, 2009  (DE) .......................... 10 2009 008 506

(51) Int. Cl.
*H01R 9/09* (2006.01)
(52) U.S. Cl. .................................. 439/607.41
(58) Field of Classification Search .................. 439/607, 439/98, 89.278, 149; 174/669, 11, 65 R, 174/65 C, 360
See application file for complete search history.

(56) References Cited

U.S. PATENT DOCUMENTS

| 2,727,088 | A | * | 12/1955 | La Wall | 174/135 |
| 5,058,172 | A | * | 10/1991 | Ross et al. | 381/122 |
| 5,838,535 | A |   | 11/1998 | Krusel et al. | |
| 5,886,294 | A | * | 3/1999 | Scrimpshire et al. | 174/359 |
| 5,915,056 | A | * | 6/1999 | Bradley et al. | 385/76 |
| 6,207,893 | B1 |   | 3/2001 | Guiol | |
| 6,359,224 | B1 | * | 3/2002 | Beele | 174/665 |
| 6,482,017 | B1 | * | 11/2002 | Van Doorn | 439/89 |
| 7,790,989 | B2 |   | 9/2010 | Delakowitz | |
| 2004/0118582 | A1 | | 6/2004 | Deguchi | |
| 2006/0239620 | A1 | | 10/2006 | Brownjohn | |

FOREIGN PATENT DOCUMENTS

| DE | 3711937 | 7/1988 |
| DE | 196 01518 A1 | 7/1997 |
| DE | 198 38951 C1 | 5/2000 |

(Continued)

OTHER PUBLICATIONS

German Office Action for DE 102009008506.8 dated Oct. 27, 2009.
International Search Report for PCT/EP2010051684 (WO2010/092101) with English translation of Written Opinion dated Jun. 10, 2010.

*Primary Examiner* — Alexander Gilman
(74) *Attorney, Agent, or Firm* — Jenkins, Wilson, Taylor & hunt, P.A.

(57) ABSTRACT

The invention relates to a cable connection device for connecting a cable to a housing that is to be electromagnetically shielded, comprising a sheath, which serves to surround the cable in the region of a cable feedthrough opening in the housing and is designed to be electrically conductive at least at its surface. In order to achieve a cable connection device with a simple design which can be used for different cables and has improved shielding, the invention proposes that the sheath completely covers a cable feedthrough opening, which is associated with the housing, when viewed in a direction axial to the cable feedthrough opening, the sheath being provided with shielding structures for damping electromagnetic radiation on an inner surface, which points towards the cable to be accommodated.

12 Claims, 2 Drawing Sheets

FOREIGN PATENT DOCUMENTS

| | | |
|---|---|---|
| DE | 699 08312 T2 | 2/2004 |
| DE | 20 2005020718 | 6/2006 |
| DE | 10 2005016340 | 8/2006 |
| EP | 0497463 A2 | 8/1992 |
| WO | WO 98/41077 | 9/1998 |
| WO | WO 2004/097484 | 11/2004 |

* cited by examiner

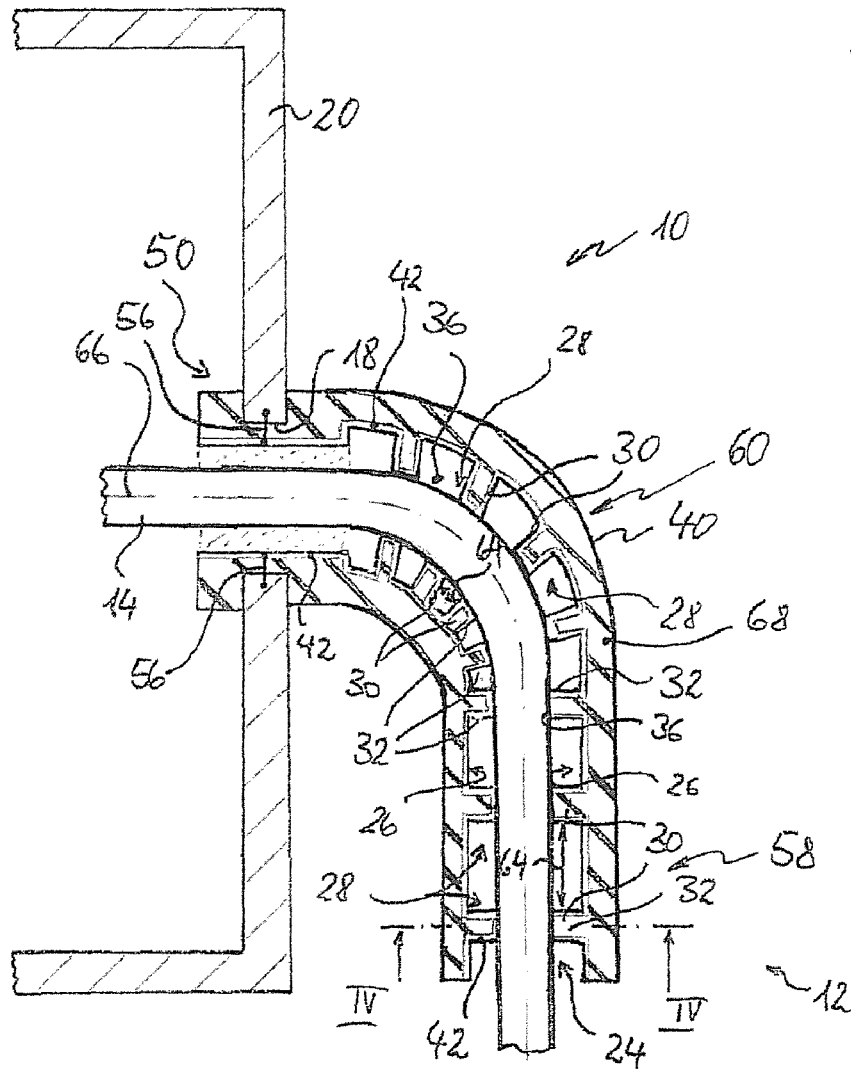
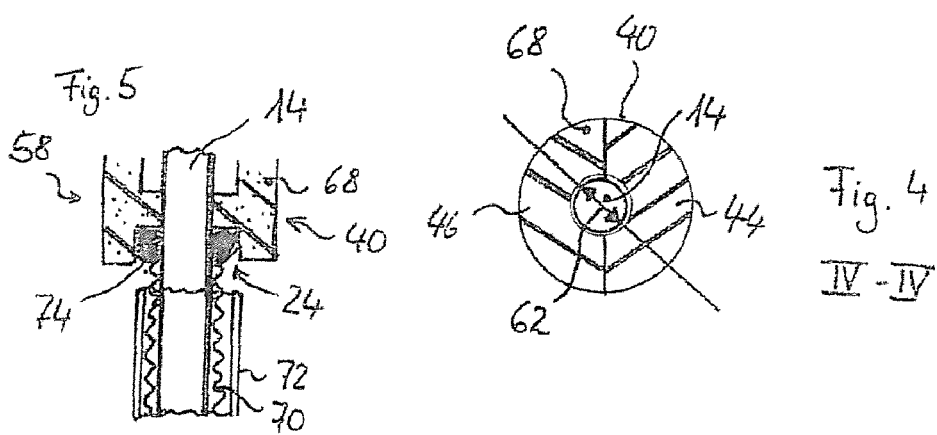

CABLE CONNECTION DEVICE, LINE FEEDTHROUGH PROVIDED THEREWITH, AND USE THEREOF

CROSS-REFERENCE TO RELATED APPLICATIONS

This application is a continuation of PCT/EP2010/051684 filed Feb. 11, 2010 and claims the benefit of and priority to German Patent Application No. 10 2009 008 506.8, filed Feb. 12, 2009, the entire disclosures of which are herein incorporated by reference.

FIELD OF THE INVENTION

The invention relates to a cable connection device for connecting a cable to a housing that is to be shielded electrically in accordance with the preamble of patent claim 1, as is disclosed in DE 198 38 951 C1, for example. Hereafter, more detailed reference is made to said document. In addition, the invention relates to a line feedthrough provided with such a cable connection device for feeding an optical or electrical line through a feedthrough opening in a housing that is to be electromagnetically shielded, such as in particular a metal housing. Finally, the invention relates to a use for such a cable connection device.

It is often desirable or necessary to shield electronic component parts with respect to electromagnetic radiation. For example, important electronic component parts should not be influenced by electromagnetic radiation from the outside in order for an aircraft to function. In many cases it is also desirable to shield electronic component parts emitting electromagnetic radiation in such a way that they do not influence adjacent components. For this purpose, electronic component parts are often accommodated in metal housings. If, however, electrical or optical lines are intended to be connected to the electronic component parts, feedthrough openings are required, through which the electromagnetic radiation could enter.

Shielded copper cables are often used for connection purposes, with the shielding being formed by an electrically conductive outer sleeve. If this shielding is connected to the metal housing, the shielding of the cable merely forms an extension of the shielding of the metal housing. If the shielding of the cable is not connected to the metal housing, it is subject to electric flux and there is no shielding effect. If the copper cable is not shielded, the cable acts in the same way as an antenna which passes electromagnetic radiation into or out of the metal housing. To this extent, in the case of electrical lines, such as in particular copper cables, electromagnetic shielding by virtue of electrically connecting a metallic sheath layer of the cable to the metal housing is already used in many cases. On the other hand, feedthroughs for optical lines are often dispensed with. Optical lines are usually formed from fiberoptic cables and from other electrically nonconductive materials. Since the optical fibers are not influenced by electromagnetic radiation and do not themselves emit electromagnetic radiation either, there is the tendency to assume that no electromagnetic shielding is required. In fact, the optical fibers do not need to be shielded in the region of their external run, but the interface between the optical lines and electronics to be shielded represents a problem. In particular, the optical connector represents a problem. If an optical cable is fed through the outer shielding of a metal housing, this represents a window through which electromagnetic radiation can pass into or out of the shielding housing.

EP 0 497 463 A2, WO 2004/097 484 A1 and US 2006/0239620 A1 have disclosed cable connection devices for connecting optical lines which are in the form of connectors of fiberoptic cables and provide a certain amount of electromagnetic shielding.

DE 20 2005 020 718 U1 has disclosed a cable feedthrough element consisting of an elastic basic material with electrically conductive basic material, which has a sealing lip for enveloping and fixing a cable to be fed through.

DE 10 2005 016 340 B3 describes a device for universal cable feedthrough with a sealing lip consisting of an elastic basic material, said device having a plurality of step-shaped laminations for enveloping and fixing a cable to be fed through.

DE 196 01 518 A1 has disclosed a housing for an electrical assembly, said housing having a fixing means for fixing electrical connection cables.

DE 198 38 951 C1, mentioned at the outset, has disclosed a cable connection device in accordance with the preamble of patent claim 1 in the form of a feedthrough which is resistant to high frequencies and has a channel arranged on an electrically conductive housing and an elastically flexible contact-pressure element. The cable, which is pressed against the base of the channel in contact-making fashion by the contact-pressure element with its bare-metal shielding, is deflected through 90° in the channel.

DE 699 08 312 T2 discloses a feedthrough with a sealing collar, the collar having elevations for sealing the feedthrough in a gas-tight manner.

US 2004/011858211 has disclosed a structure for suppressing noise for a shielded cable, with conductive seals being fitted to the outset of said structure which are opposite one another with an offset.

SUMMARY OF THE INVENTION

In comparison with the prior art, the object of the invention is to design a cable connection device in such a way that it can be used universally with a relatively simple design and provides electromagnetic shielding which is as improved as possible.

This object is achieved by a cable connection device having the features of claim 1, appended.

Advantageous configurations of the invention are the subject matter of the dependent claims.

Advantageous uses of the invention are the subject matter of the alternative independent claims.

The invention provides a cable connection device for connecting a cable to a housing that is to be electromagnetically shielded, comprising a sheath, which serves to surround the cable in the region of a cable feedthrough opening in the housing and is designed so as to be electrically conductive at least at its surface, the sheath completely covering a cable feedthrough opening associated with the housing, when viewed in a direction axial to the cable feedthrough opening.

The invention further provides, for the sheath to be provided with shielding structures for damping electromagnetic radiation on an inner surface, which points towards the cable to be accommodated.

The cable connection device according to the invention has a sheath, which is designed in such a way that it surrounds a cable in the region of a cable feedthrough opening of the housing and is designed to be electrically conductive completely or at least at one of its surfaces. The sheath is further designed in such a way that it completely covers a cable feedthrough opening, through which the cable or a line is to be fed, when viewed in the axial direction of the cable feedthrough opening. As a result, no electromagnetic radiation can pass through the cable feedthrough opening along a linearly continuous path. In addition, the sheath has shielding structures for damping electromagnetic radiation on an inner surface, which points towards the cable to be accommodated. As a result, electromagnetic waves which attempt to enter the housing along the inner surface of the sheath can be damped, with the result that electromagnetic radiation cannot pass into or out of the housing to be shielded, either by direct radiation into said housing or via the inner surface of the sheath.

By virtue of this amazingly simple design, it is possible to produce a universal cable connection device, with which both optical cables and electrical cables can be connected to a housing that is to be electromagnetically shielded in the region of a cable feedthrough opening in the housing in electrically shielding fashion.

In a particularly preferred manner, the sheath can be in the form of a cable strain-relief means. To this extent, in addition to the shielding function, a function as strain-relief means can also be realized at the same time.

Covering of the cable feedthrough opening is preferably achieved in such a way that the sheath guides the cable on a bent-back or curved path. The cable is therefore guided on a curved or bent-back path between an end region of the sheath, said end region being associated with the cable feedthrough opening in the housing, and a cable inlet, where the cable enters the sheath from the outside. There is therefore no linear feedthrough through the sheath, with the result that electromagnetic radiation which should enter the sheath would need to be deflected at least once in order to be able to pass through the sheath. Such radiation is weakened by the shielding structures, however, with the result that perfect shielding is possible.

For example, the sheath is designed to deflect the cable through approximately 45 to 135 degrees, preferably through approximately 60 to 120° and more particularly through approximately 90°±5°. In particular, the cable is deflected through approximately 90 degrees or correspondingly adjacent angles, for example between 60 and 120 degrees. A deflection through 90 degrees is particularly preferred.

In particular in order to damp mechanical loads on the cable, for example impacts or sudden tensile loading, it is further preferred for the sheath to be formed from an elastic material, for example from a rubber material or from a polymer. In order to fulfill the shielding function, this material is either designed to be completely electrically conductive itself, i.e. to be in the form of an electrically conductive rubber material or conductive polymer, for example, or to be coated or clad with an electrically conductive material at least at its inner surface, preferably completely.

The electromagnetic shielding structures preferably have optical baffles and/or electromagnetic baffles. In particular, the shielding structures further preferably have a plurality of ribs. The ribs are preferably arranged transversely with respect to the cable run. Further preferably, the ribs protrude at the location at which the cable is intended to be accommodated.

The baffles or ribs can follow on from one another at regular intervals, in a similar way to as is already known in optical baffles in optical devices. However, irregular intervals are also possible and possibly even advantageous. The use of irregular intervals makes it possible to avoid possible resonances, for example. By way of example, the intervals for the baffles or ribs are designed to be greater in the region of an inlet of the cable connection device and smaller in the region of a curvature or bent-back portion.

The cable connection device can be used for connecting an optical cable or an electrical cable. Particularly preferably, it is used as strain-relief means for optical cables, said strain-relief means at the same time providing shielding for the cable feedthrough opening.

In accordance with a further aspect, a line feedthrough for feeding an optical or electrical line through a feedthrough opening in a housing that is to be electromagnetically shielded is provided, the line feedthrough having an optical or electrical cable which is fed through the feedthrough opening in the form of a cable feedthrough opening and is further provided with the cable connection device according to the invention for shielding the cable feedthrough opening.

The cable connection device is preferably matched to the thickness of the cable. Preferably, the shielding structures make contact with the outer wall of the cable. As a result, the optical shielding structures are fed as close as possible up to the cable, with the result that electromagnetic waves running along the surface of the cable are damped by the shielding structures. In the case of a shielded copper cable, it would thus also be possible for contact to be produced between the outer shielding of the copper cable and the metal housing. Furthermore, a possible function as a cable strain-relief means is thus ensured in a particularly advantageous manner.

BRIEF DESCRIPTION OF THE DRAWINGS

Exemplary embodiments of the invention will be explained in more detail below with reference to the attached drawings, in which:

FIG. 3 shows a schematic sectional view through a third embodiment of a cable connection device; and FIG. 4 shows a section along the line IV-IV in FIG. 3; and FIG. 5 shows an inlet region of a developed embodiment of the cable connection device.

DESCRIPTION OF EXEMPLARY EMBODIMENTS

Figure 1:
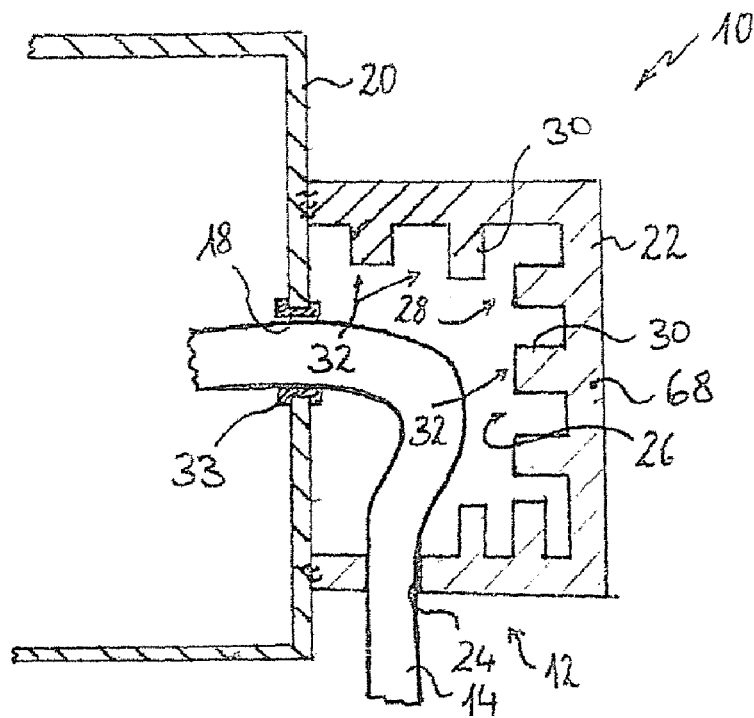
FIG. 1 shows a schematic sectional illustration through a first embodiment of a cable connection device.

The figures illustrate different embodiments of a cable connection device with the overall designation 10, wherein the same reference numerals are used for identical or corresponding parts. The cable connection device 10 is used for forming a line feedthrough 12, in which an optical or electrical cable 14 is passed through a cable feedthrough opening 18 in a metal housing 20.

The metal housing 20 serves to accommodate electronics (not illustrated), which are intended to be shielded with respect to electromagnetic radiation from the outside or with respect to the emission of electromagnetic radiation from the electronics. Therefore, said electronics are accommodated in the electrically conductive metal housing 20. However, electromagnetic radiation could pass through the cable feedthrough opening 18.

Cables 14, which pass out of an electromagnetically sealed metal housing 20 can have the effect that electromagnetic radiation can enter the metal housing 20. This can occur to an even greater extent if the cable 14 is fiberoptic cables which transport optical data out of the metal housing 20.

Therefore, FIG. 1 illustrates a first embodiment of a cable connection device 10 for shielding the cable feedthrough opening 18 to prevent electromagnetic radiation from entering or to prevent electromagnetic radiation from being emitted. The cable connection device 10 shown in FIG. 1 has a relatively small housing ("dog-housing") consisting of an electrically conductive material, in particular of metal. This housing 22 has a further opening 24, an inlet opening, which is at an angle of substantially 90 degrees with respect to the cable feedthrough opening 18. This prevents electromagnetic radiation from entering the metal housing 20 to be shielded. Further electromagnetic shielding structures 28 are provided on that inner surface 26 of the housing 22 which points towards the cable 14. The shielding structures 28 have so-called optical baffles 30, which are designed in such a way that electromagnetic waves which run along the inner surface 26 are damped.

For this purpose, a plurality of ribs 32 are provided, said ribs being formed integrally from the electrically conductive material of the housing 22.

Figure 2:
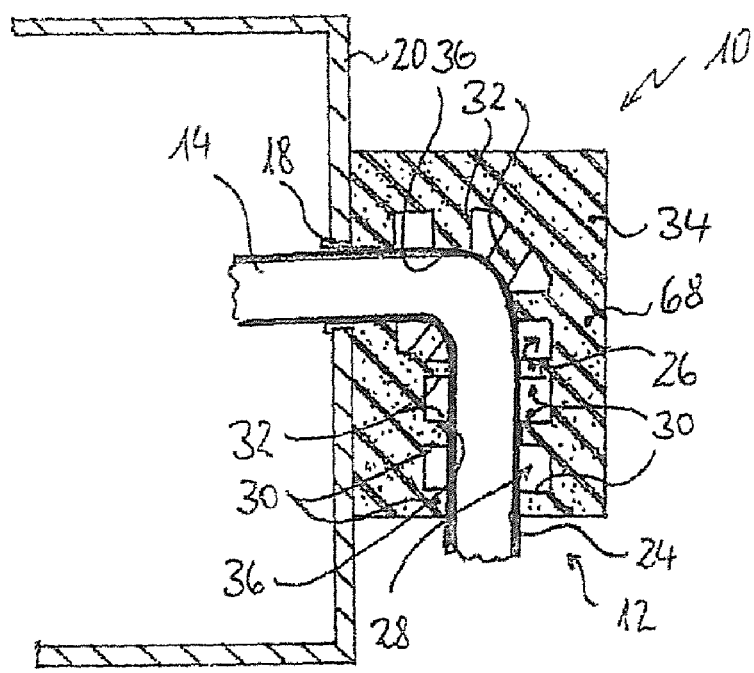
FIG. 2 shows a schematic sectional view through a second embodiment of a cable connection device.

In a second exemplary embodiment of the cable connection device 10 illustrated in FIG. 2, a parallelepipedal block 34 consisting of conductive rubber material is used instead of the housing 22 consisting of metal. In order to form the cable connection device 10 and the line feedthrough 12, this block 34 is cut into two pieces, with a cable guide groove 36 for guiding the cable 14 being introduced into the interior of said block at an angle of substantially 90 degrees. In the example illustrated in FIG. 2, this cable guide groove 36 is in turn provided with the baffles 30 or the ribs 32. Once the cable 14 has been inserted, the two halves are adhesively bonded to one another and the metal housing 20 again.

An annular projection for engaging in this feedthrough opening 18 in the metal housing 20 is formed on the block 34 in the region of the cable feedthrough opening 18. As a result, it is firstly possible to produce good metallic conductive contact with the metal housing 20 and secondly the cable 14 is protected from abrasion at the cable feedthrough opening 18. The protection against abrasion is provided by a rubber ring 33 in the embodiment shown in FIG. 1. In the embodiment shown in FIG. 2, this rubber ring 33 is formed integrally with the block 34.

FIGS. 3 and 4 show a particularly preferred further embodiment of the cable connection device 10, in which the cable connection device is at the same time in the form of a cable strain-relief means 40. This embodiment shown in FIGS. 3 and 4 will be explained in more detail below.

The cable strain-relief means 40 is provided with optical baffles 30 in the form of ribs 32 in the interior, on its inner surface 26 which points towards the cable 14, and is bent through approximately 90 degrees, with the result that it is not possible for any electromagnetic radiation to enter the metal housing 20 or to escape from the interior of the metal housing 20 through the cable feedthrough opening 18.

The arrangement of so-called baffles 30 within the cable strain-relief means 40 and a curvature 60 through approximately 90 degrees of the cable strain-relief means 40 prevents electromagnetic radiation from entering into or being emitted from metallic housings such as the metal housing 20, for example.

In principle, the cable strain-relief means 40 can also be linear, but in an embodiment (not illustrated) of the cable strain-relief means with a linear profile, the cable strain-relief means 40 is arranged offset with respect to the cable feedthrough opening 18, with the result that there is no linear line of view from the outside through the cable feedthrough opening 18. In general, the cable connection device 10 is designed in such a way that, when viewed in the direction axial to the cable feedthrough opening 18, it covers the cable feedthrough opening 18 as completely as possible, with the result that there is no linear line of view into the metal housing 20 and it is not possible for electromagnetic radiation to pass linearly through the cable feedthrough opening 18.

By virtue of the cable strain-relief means 40 illustrated, electromagnetic shielding is also provided in addition to the function of strain-relief means. Advantageously, there is therefore no emission or immision of electromagnetic radiation through openings in the metal housing 20.

The baffles 30 are arranged in such a way that they prevent microwaves from entering electronic boxes.

The cable strain-relief means 40 for the cable 14, which is in the form of an optical cable, for example, and emerges from the metal housing 20, is formed from an electrically slideable rubber material or a conductive polymer. Both materials can be cast in a special mold or casting mold, for example injection-molded, for the production. When using electrically conductive rubber material or electrically conductive polymer, the entire cable strain-relief means 40 is designed to be electrically conductive.

However, it is also sufficient in principle for damping electromagnetic radiation if a surface layer 42 on the inner surface 26 is designed to be electrically conductive.

For example, the cable strain-relief means 40, as is illustrated in FIG. 4, is formed from two halves 44 and 46, which accommodate the cable 14 between them.

Electrically conductive rubber materials or polymer materials for forming these halves 44, 46 are available on the market, for example, from the company Seal Science Incorporated, 17 131 Daimler Street, Ervine, Calif. 92614-5508. On the other hand, it is also possible for a nonconductive rubber or a nonconductive polymer material to be provided which is provided with the conductive surface to layer 42 on the inner surface 26. The surface layer 42 could be formed, for example, by a material acting as electromagnetically shielding material, for example shrink material, as is available, for example, from the company Chomerics, Parker Hannifin Corporation.

The cable strain-relief means 40 could be adhesively bonded to the metal housing 20 in a manner comparable to that used for the block 34. In the embodiment illustrated in FIG. 3, a first end region 50 which is associated with the cable feedthrough opening 18 is provided on the outside with an annular groove 52 for accommodating the edge 54 of the cable feedthrough opening 18. For connection purposes, the first end region 50 is then forced through the cable feedthrough opening 18 until the annular groove 52 accommodates the edge 54 in a form-fitting manner. This connection is similar to the connection of the rubber disk with external grooves, the rubber ring 33, which serves the purpose in the embodiment shown in FIG. 1 of protecting insulation of a cable 14 which has been fed through the cable feedthrough opening 18 from being damaged by the edge 54. In the embodiment shown in FIG. 1, this rubber ring 33 is in close contact with the outer wall and any shielding of the cable 14.

As is illustrated in FIG. 3 by dashed lines, in a corresponding further embodiment of the cable strain-relief means 40, the inner region of the first end region 50 could also have a correspondingly close configuration, with the result that it surrounds the outer wall of the cable 14 with close contact.

In the first end region 50, for an embodiment consisting of nonconductive material with a conductive surface layer 42, another electrically conductive connection 56 between this surface layer 42 and the metal housing 20 is indicated.

FIG. 3 illustrates only a single line feedthrough 12 for a single cable 14. In general, a plurality of such line feedthroughs 12 for a large number of cables 14 is provided. Preferably, a dedicated cable strain-relief means 40 is provided for each of these cables 14. As a result, the baffles 30 can be in close contact with the cable 14. It is also possible for a curvature through approximately 90° to be formed between the cable feedthrough 18 and the inlet opening 24, which ensures that the electromagnetic radiation impinges on the baffles 30 and is absorbed there. Although in principle it is conceivable and possible for a plurality of cables 14 to be guided by a cable strain-relief means 40, the main aim of the construction shown here is for the cable guide groove 36 and the curvature 60, which is positioned between the first end region 50 and the second end region 58, having the inlet opening 54, to be able to contain sufficient baffles 30 or ribs 32 for safely, damping electromagnetic radiation and for preventing this electromagnetic radiation from entering the metal housing 20 or emerging from the metal housing 20.

If a plurality of cables 14 with different diameters are provided, correspondingly formed cable strain-relief means 40 with a cable guide groove 36 matched to the respective diameter are also provided. The construction is in each case such that a hole diameter 62, the bending radius of the curvature 60 and the sequence of baffles 30 or ribs 32 prevent electromagnetic radiation from entering or emerging from the housing 20.

The interval 64 between the individual baffles 30 or ribs 32 does not necessarily need to be equidistant. As illustrated in FIG. 3, the interval 64 can be such that the interval 64 between the ribs is great at the second end region 58 close to the inlet opening 24, but is smaller in the region of the curvature 60.

As already mentioned above, in the exemplary embodiment illustrated in FIGS. 3 and 4, the cable strain-relief means 40 is formed from at least two parts, first and second halves 44, 46. In a further embodiment (not illustrated), the cable strain-relief means 40 is formed in one piece, for example by means of injection molding. The embodiment with two halves 44, 46 is preferred for improved guidance of the cable 14. The two halves 44, 46 are adhesively bonded to one another in such a way that the cable 14 is held fixedly even in the cable longitudinal direction, illustrated by a dash-dotted line 66 in FIG. 3.

In the embodiment illustrated, the baffles 30 or ribs 32 are formed from the same material as the sheath 68 surrounding the cable 14. At least the inner surface 46 formed by the surface layer 42 with the baffles 30 and ribs 32 is designed to be electrically conductive. Therefore, the shielding structures 28 are electrically conductive. As already mentioned, this can be achieved in principle by two measures. The baffles 30 or ribs 32 could be formed from electrically conductive material in the same way as the entire sheath 68 and cable strain-relief means 40. In another embodiment, only the surface layer 42 is designed to be electrically conductive. How this is implemented in terms of production has already been described above.

In a further embodiment (not illustrated in any more detail here), only a tubular sheath 68 with a flat inner surface is provided, with an inner sleeve consisting of electrically conductive material being inserted into said sheath, wherein the shielding structures 28 are formed on said inner sleeve from the material of the inner sleeve.

FIG. 5 illustrates, as a schematic sectional view, of only the second end region 58 in the region of the inlet opening 54, the situation in which the cable 14 is a cable which has been provided with a, for example woven, electrical shielding layer 70 beneath an outer insulating layer 72. In this case, the shielding layer 70 is electrically conductively connected to the cable strain-relief means 40 and therefore to the metal housing 20 by an electrical connection 74. The shielding layer 70 ends precisely within the inlet region to the section provided with the shielding structures 28 in order to ensure that any residual signal radiates towards the baffles 30/ribs 32 and is absorbed or reflected there and is not exactly passed on within a braided tube.

An advantage of the cable connection device 10, which is in the form of a cable strain-relief means 40 and is illustrated in FIG. 3, over the block-like cable connection devices illustrated in FIGS. 1 and 2 is that the cable 14 and the cable strain-relief means 40 can in principle also be bent in other directions or else can be rotated about the center of the cable feedthrough opening 18 as center of rotation. As long as the curvature 60 is maintained in such a way that there is no direct line of view between the cable feedthrough opening 18 and the inlet opening 24, the shielding effect is at least largely maintained.

The baffles 30 or ribs are used as stoppers or absorbing points in an electrically conductive material. There, electromagnetic radiation has a dead end and is absorbed before it reaches the metal housing 20 or emerges from the inlet opening 24, coming from the metal housing 20. Comparable optical baffles are used already in optical instruments for shielding scattered optical radiation, as is described in more detail, for example, by Lucimara C. N. Scaduto et al. in the article "Baffle Design and Analysis of Stray-light in Multispectral Camera of a Brazilian Satellite—Annals of Optiks, 2006. In said document, however, only stray light is intercepted correspondingly. Similar ideas are used in thermal sensors in special enclosures in order to keep scattered thermal radiation away from the sensor. In the cable connection device 10 illustrated here, the optical baffles 30 are used as EMC baffles in order to protect electronic equipment. This is used in particular wherever optical connections and optical connectors are used on the cables 14, wherein a considerable portion of the optical connector is designed to be nonconductive and therefore is designed to be transparent to electromagnetic radiation.

By virtue of the cable connection device 10 in the form of a cable strain-relief means 40, for example, a line feedthrough 12 in particular for optical cables 14 is provided, said line feedthrough also being fully electromagnetically shielded for feeding through optical lines.

LIST OF REFERENCE NUMBERS

10 Cable connection device
12 Line feedthrough
14 Cable
18 Cable feedthrough opening
20 Metal housing
22 Housing consisting of metal
24 Further opening (inlet opening)
26 Inner surface
28 Shielding structures
30 Optical baffle
32 Ribs
33 Rubber ring
34 Block
36 Cable guide groove
40 Cable strain-relief means
42 Surface layer
44 First half
46 Second half
50 First end region
52 Annular groove
54 Edge
56 Electrical connection
58 Second end region
60 Curvature 62 Hole diameter
66 Cable longitudinal direction
68 Sheath
70 Shielding layer
72 Outer insulation
74 Electrical connection

The invention claimed is:

1. A cable connection device for connecting a cable to a housing that is to be electromagnetically shielded, the cable connecting device comprising:
a sheath which serves to surround the cable from a cable inlet opening to a cable feedthrough opening in the housing such that there is no direct line of view between the cable inlet opening and the cable feedthrough opening, the sheath being designed so as to be electrically conductive at least at its surface, and the sheath completely covering a cable feedthrough opening associated with the housing, when viewed in a direction axial to the cable feedthrough opening;
a plurality of shielding structures provided on the inner surface of the sheath from the cable inlet opening to the cable feedthrough opening for damping electromagnetic radiation on an inner surface, wherein each of the plurality of shielding structures points towards the cable to be accommodated, characterized in that the sheath is in the form of cable strain-relief means.

2. The cable connection device as claimed in claim 1, wherein the sheath is configured to guide the cable on a bent-back and/or curved path from the cable inlet opening to the cable feedthrough opening.

3. The cable connection device as claimed in claim 2, wherein the sheath is configured to deflect the cable through approximately 45 to 135°.

4. The cable connection device as claimed in claim 1, wherein the sheath is formed from a conductive rubber material or a conductive polymer or from an electrically conductively coated elastic material.

5. The cable connection device as claimed in claim 1, wherein the plurality of shielding structures have optical and/or electromagnetic baffles.

6. The cable connection device as claimed in claim 5, wherein the baffles or ribs follow on from one another at regular or irregular intervals, when viewed in the direction of the cable run, with the irregular intervals being designed to be greater proximate the cable inlet opening of the cable connection device and smaller in the region of a curvature.

7. The cable connection device as claimed in claim 1, wherein the plurality of shielding structures have a plurality of ribs, which are arranged transversely with respect to a cable run and protrude in the direction of the cable.

8. The cable connection device as claimed in claim 1, wherein it is designed for connecting an optical or electrical cable.

9. A line feedthrough for feeding an optical or electrical line through a feedthrough opening in a housing that is to be electromagnetically shielded, the line feedthrough comprising an optical or electrical cable, which is intended to be fed through the feedthrough opening in the form of a cable feedthrough opening, and a cable connection device as claimed in any one of the preceding claims.

10. The line feedthrough as claimed in claim 9, wherein the shielding structures make contact with the cable.

11. The use of a cable connection device as claimed in claim 1 for connecting or feeding an electrical or optical cable or an electrical or optical line through the cable feedthrough opening in the housing that is to be electromagnetically shielded.

12. A cable connection device for connecting a cable to a housing that is to be electromagnetically shielded, the cable connecting device comprising:
a sheath for surrounding a portion of the cable, the sheath comprising a first end portion and an opposing second end portion, wherein the first end portion is disposed proximate a cable feedthrough opening of the housing and wherein the second end portion comprises a cable inlet opening, the sheath further comprising an electrically conductive material at least at its surface, and the sheath completely covering the cable feedthrough opening of the housing when viewed in a direction axial to the cable feedthrough opening;
a plurality of shielding structures for damping electromagnetic radiation, wherein the plurality of shielding structures are disposed at irregular intervals along an inner surface of the sheath between the first end portion and the second end portion.

* * * * *